US012650471B2

(12) United States Patent
Kato et al.

(10) Patent No.: US 12,650,471 B2
(45) Date of Patent: Jun. 9, 2026

(54) INFORMATION PROCESSING DEVICE AND INFORMATION PROCESSING SYSTEM

(71) Applicant: Panasonic Intellectual Property Management Co., Ltd., Osaka (JP)

(72) Inventors: Hiroshi Kato, Tokyo To (JP); Takuma Iida, Kanagawa Ken (JP); Masashi Fumoto, Kanagawa Ken (JP)

(73) Assignee: Panasonic Automotive Systems Co., Ltd., Kanagawa (JP)

( * ) Notice: Subject to any disclaimer, the term of this patent is extended or adjusted under 35 U.S.C. 154(b) by 923 days.

(21) Appl. No.: 17/947,913

(22) Filed: Sep. 19, 2022

(65) Prior Publication Data

US 2023/0011596 A1     Jan. 12, 2023

Related U.S. Application Data

(63) Continuation of application No. PCT/JP2020/048587, filed on Dec. 24, 2020.

(30) Foreign Application Priority Data

Mar. 25, 2020     (JP) ................................. 2020-055101

(51) Int. Cl.
  *G01R 31/382*     (2019.01)
  *B60L 53/53*     (2019.01)
(52) U.S. Cl.
  CPC ............ *G01R 31/382* (2019.01); *B60L 53/53* (2019.02)
(58) Field of Classification Search
  CPC ... G01R 31/382; B60L 53/53; B60L 2250/16; B60L 53/665; B60L 53/80
  See application file for complete search history.

(56) References Cited

U.S. PATENT DOCUMENTS

2005/0080641 A1 *  4/2005  Ronning ................ G06Q 30/02
                                                      705/20
2011/0047102 A1    2/2011  Grider et al.
                           (Continued)

FOREIGN PATENT DOCUMENTS

JP          2014-011860        1/2014
JP          6951550           10/2021
                   (Continued)

OTHER PUBLICATIONS

International Search Report (ISR) from International Searching Authority (Japan Patent Office) in International Pat. Appl. No. PCT/JP2020/048587, dated Mar. 23, 2021, together with an English language translation.

(Continued)

*Primary Examiner* — Ricky Go
(74) *Attorney, Agent, or Firm* — Greenblum & Bernstein, P.L.C.

(57) ABSTRACT

An information processing device according to the present application includes a hardware processor functioning as an acquisition unit, a determination unit, and a provision unit. The acquisition unit acquires user information that is information relative to a user. The determination unit determines a recommended battery on the basis of the user information acquired by the acquisition unit. The recommended battery is recommended to the user and used for a moving object. The provision unit provides information relative to the recommended battery determined by the determination unit.

18 Claims, 6 Drawing Sheets

(56) References Cited

U.S. PATENT DOCUMENTS

| | | | | |
|---|---|---|---|---|
| 2013/0332370 A1* | 12/2013 | Hyde | ..................... | B60L 58/10 |
| | | | | 705/306 |
| 2019/0207267 A1* | 7/2019 | Vickery | ................. | B60L 53/80 |
| 2020/0402075 A1* | 12/2020 | Ebisu | ................ | G06Q 30/0645 |
| 2021/0004879 A1* | 1/2021 | Nakajima | .......... | G06Q 30/0283 |

FOREIGN PATENT DOCUMENTS

| | | |
|---|---|---|
| WO | 2019/163574 | 8/2019 |
| WO | 2019/181659 | 9/2019 |

OTHER PUBLICATIONS

Notice of Allowance from Japan Patent Office (JPO) in Japanese Patent Appl. No. 2020-055101, dated Sep. 26, 2023, together with an English language translation.
Office Action issued by the German Patent and Trademark Office in German Patent Appl. No. 112020006969.9, dated Feb. 23, 2026, together with an English language translation.

* cited by examiner

FIG.4

| USER ID | USER INFORMATION | | | | | |
|---|---|---|---|---|---|---|
| | USE HISTORY | ATTRIBUTE INFORMATION | INTEREST | USE HISTORY OF MOVING OBJECT | POSITION INFORMATION | ⋮ |
| U1 | UE1 | CA1 | IN1 | MO1 | LO1 | ⋮ |
| U2 | UE2 | CA2 | IN2 | MO2 | LO2 | ⋮ |
| U3 | UE3 | CA3 | IN3 | MO3 | LO3 | ⋮ |
| ⋮ | ⋮ | ⋮ | ⋮ | ⋮ | ⋮ | ⋮ |

| BATTERY ID | BATTERY INFORMATION | | | | | | |
|---|---|---|---|---|---|---|---|
| | SOURCE INFORMATION | FEE INFORMATION | POWER VALUE | USE HISTORY | | | |
| B1 | RENEWABLE ENERGY | DA1 | VO1 | U1 | UE1 | ⋮ | ⋮ |
| B2 | RENEWABLE ENERGY | DA2 | VO2 | U1 | UE2 | ⋮ | ⋮ |
| B3 | NON-RENEWABLE ENERGY | DA3 | VO3 | U2 | UE3 | ⋮ | ⋮ |
| ⋮ | ⋮ | ⋮ | ⋮ | ⋮ | ⋮ | ⋮ | ⋮ |

START

ACQUIRE USER INFORMATION ⌇S101

PREDETERMINED TIMING? ⌇S102

NO

YES

DETERMINE RECOMMENDED BATTERY ON THE BASIS OF USER INFORMATION ⌇S103

PROVIDE DISPLAY DEVICE 10 WITH INFORMATION ON RECOMMENDED BATTERY ⌇S104

END

OUTPUT DEVICE ⌇1010

INPUT DEVICE ⌇1020

⌇1000

ARITHMETIC DEVICE ⌇1030

OUTPUT IF ⌇1060

INPUT IF ⌇1070

⌇1090

PRIMARY STORAGE DEVICE ⌇1040

SECONDARY STORAGE DEVICE ⌇1050

NETWORK IF ⌇1080

N

INFORMATION PROCESSING DEVICE AND INFORMATION PROCESSING SYSTEM

CROSS-REFERENCE TO RELATED APPLICATIONS

This application is national stage application of International Application No. PCT/JP2020/048587, filed Dec. 24, 2020, which designates the United States, incorporated herein by reference, and which claims the benefit of priority from Japanese Patent Application No. 2020-055101, filed Mar. 25, 2020, the entire contents of which are incorporated herein by reference.

FIELD

The present disclosure relates to an information processing device and an information processing system.

BACKGROUND

Conventionally, there has been known a power management system that stabilizes power by charging a portable battery with power having low power quality in which a power generation amount irreversibly fluctuates, and that is used in an electric vehicle or the like (for example, JP 2014-011860 A).

SUMMARY

An information processing device according to the present disclosure includes an acquisition unit, a determination unit, and a provision unit. The acquisition unit acquires user information that is information relative to a user. The determination unit determines a recommended battery on the basis of the user information acquired by the acquisition unit. The recommended battery is recommended to the user and used for a moving object. The provision unit provides information relative to the recommended battery determined by the determination unit.

BRIEF DESCRIPTION OF THE DRAWINGS

FIG. 4 is a diagram illustrating an example of a user information storage unit according to the embodiment;

FIG. 5 is a diagram illustrating an example of a battery information storage unit according to the embodiment;

DETAILED DESCRIPTION

Figure 1:
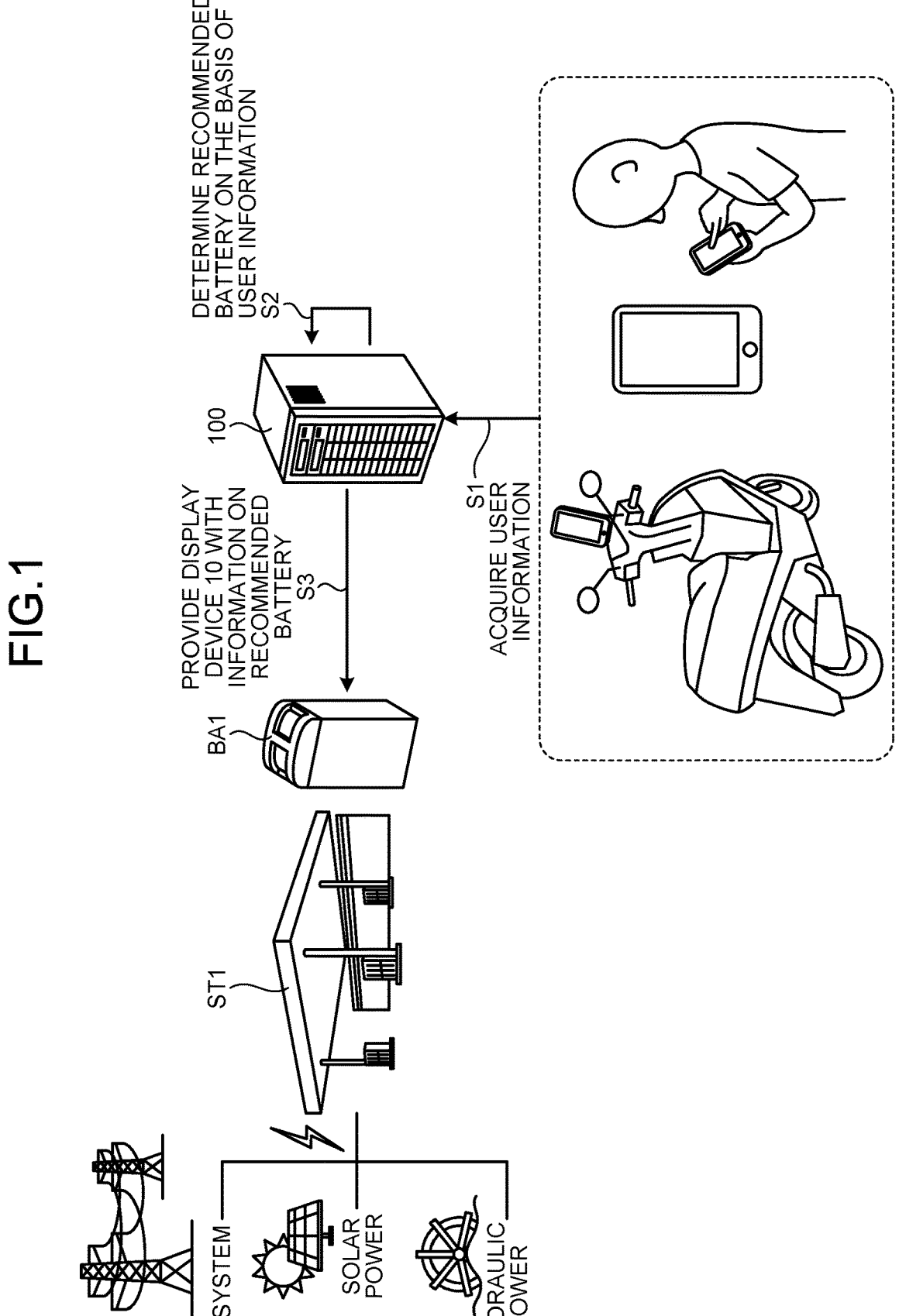
FIG. 1 is a diagram illustrating an example of information processing executed by an information processing device according to an embodiment.

Hereinafter, modes (hereinafter referred to as "embodiment") for implementing the information processing device and the information processing system according to the present disclosure will be described in detail with reference to the drawings. Note that the information processing device and the information processing system according to the present application are not limited by the embodiment. In addition, each embodiment can be appropriately combined within a range in which the processing contents do not contradict each other. In the following embodiments, the same parts are denoted by the same reference numerals, and redundant description will be omitted.

1. Example of Information Processing Indicated by Information Processing Device

First, an example of information processing executed by an information processing device 100 will be described with reference to FIG. 1. FIG. 1 is a diagram illustrating an example of information processing executed by the information processing device 100 according to an embodiment. Hereinafter, in FIG. 1, an example of information processing in a case where a user uses an electric motorcycle using a battery provided by a sharing service and visits a station ST1 to replace the battery used for the electric motorcycle will be described. Note that, in the following description, it is assumed that the battery is a portable battery and is a replaceable battery for driving a moving object.

As illustrated in FIG. 1, the information processing device 100 acquires user information that is information relative to a user (step S1). For example, the information processing device 100 acquires, as the user information, a use history of a battery, attribute information relative to an attribute of the user, information relative to an interest of the user, a use history of an electric motorcycle or another moving object different from the electric motorcycle, position information indicating a position of the user, and the like. For example, the information processing device 100 acquires, as the user information, source information indicating the source of the power charged in the battery used by the user from a terminal device used by the user, an in-vehicle device included in the electric motorcycle, or an external device having a storage unit in which the user information is stored in advance. The in-vehicle device referred to herein is, for example, a car navigation system or the like. In addition, it is assumed that the price of the battery varies depending on the source of the power charged in the battery. For example, in general, power obtained from thermal power generation or the like is less expensive than generated environmental power depending on renewable energy such as solar power generation, wind power generation, or hydraulic power generation. Therefore, a battery charged with power obtained from thermal power generation or the like is assumed to be less expensive than a battery charged with environmental power such as solar power generation, wind power generation, or hydraulic power generation.

Subsequently, the information processing device 100 determines, on the basis of the user information, a recommended battery recommended to the user and used for the electric motorcycle (step S2). For example, in a case where a battery whose source information of the battery is renewable energy is used a predetermined number of times or more, the information processing device 100 determines a battery BA1 charged with power obtained from solar power generation, wind power generation, hydraulic power generation, or the like as the renewable energy as the recommended battery.

On the other hand, in a case where a battery whose source information of the battery is non-renewable energy is used a predetermined number of times or more, the information processing device 100 determines a battery BA1 charged with power obtained from thermal power generation or the like as the non-renewable energy as the recommended battery.

Then, the information processing device 100 provides a display device 10 with information relative to the recommended battery (step S3). For example, it is assumed that the station ST1 has the display device 10 in advance. In this case, the information processing device 100 provides the display device 10 with information relative to the battery BA1.

Then, the display device 10 displays information relative to the battery BA1 to the user. In addition, the display device 10 displays information relative to the battery BA1 and another battery different from the battery BA1 to the user. At this time, the display device 10 displays the information relative to the battery BA1 in a predetermined display mode. For example, the display device 10 changes a color of the battery BA1 recommended to the user in accordance with a ratio of the source indicated by the source information of the power charged in the battery. As a result, the display device 10 can reduce the risk of erroneous attachment due to the user taking out the battery. The display device 10 changing the color of the battery BA1 means, for example, that the display device 10 changes the color of a light emitting portion included in the battery BA1. The light emitting portion is, for example, a light emitting diode (LED) light or the like, but is not limited thereto. Hereinafter, changing the color of the light emitting portion included in the battery BA1 is simply referred to as "changing the color of the battery BA1".

In this manner, the information processing device 100 according to the embodiment acquires the user information which is information relative to the user. Then, the information processing device 100 determines a recommended battery recommended to the user and used for the moving object on the basis of the acquired user information. Then, the information processing device 100 provides information relative to the determined recommended battery. As a result, the information processing device 100 according to the embodiment can provide an appropriate battery to the user.

Conventionally, a user's need for a battery has been power quality, cost, and the like, but with the spread of renewable energy, the value indicated by the renewable energy is being recognized by the user from the viewpoint of environmental protection. In such a background, it is necessary to provide a battery charged with power in accordance with the user's power usage status, life style, and preference, but it is difficult with the conventional technology.

In view of the above, the information processing device 100 according to the embodiment solves the conventional problem by providing information relative to a recommended battery that is recommended to a user determined on the basis of user information and is used for a moving object. Therefore, the information processing device 100 can provide a user with a battery that is appropriate for the user. As a result, the information processing device 100 can provide a service corresponding to diversification of user's needs for power and a power supply request in accordance with a life style or preference.

2. Example of Content Displayed by Display Device

Figure 2:
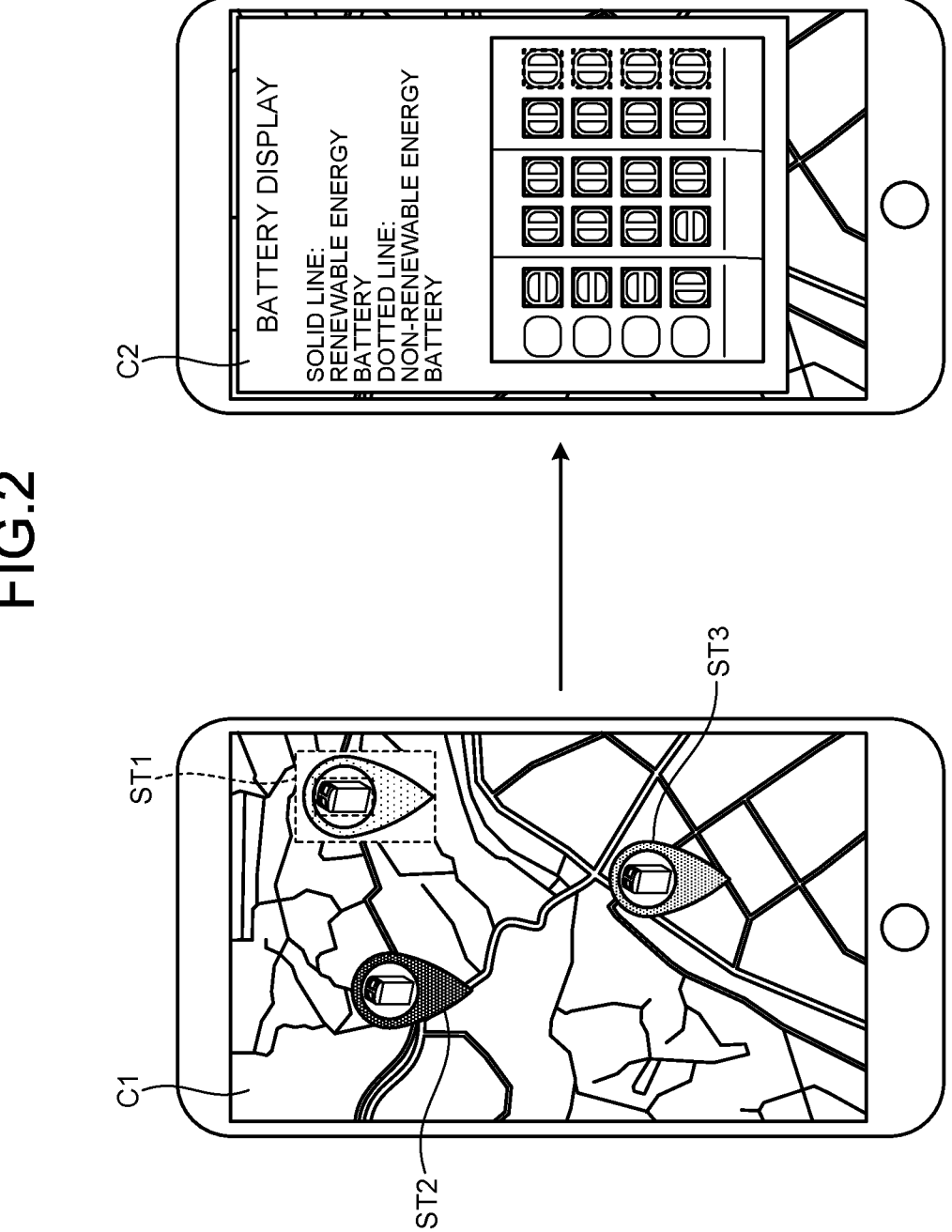
FIG. 2 is a diagram illustrating a specific example of content according to the embodiment.

A specific example of content will be described with reference to FIG. 2. FIG. 2 is a diagram illustrating a specific example of content according to the embodiment. Note that the processing illustrated in FIG. 2 corresponds to step S3 illustrated in FIG. 1. In the following description, it is assumed that the display device 10 is a terminal device used by a user.

FIG. 2 illustrates a transition example of content. In the example of FIG. 2, a content C1 includes information relative to various stations in a mode superimposed on map information. Here, the content C1 indicates different information depending on shading of an icon of the station. For example, a station ST1 has a large number of batteries charged with renewable energy, a station ST2 has a medium number of batteries charged with renewable energy, and a station ST3 has a small number of batteries charged with renewable energy.

Here, when the user presses the icon of the station ST1, the terminal device transitions to a content C2 and displays the content C2. The content C2 includes a title such as "battery display" and identification information of a battery stored in the station ST1. For example, in the content C2, a battery surrounded by a solid line indicates a battery charged with renewable energy, and a battery surrounded by a dotted line indicates a battery charged with non-renewable energy. In this manner, the content C2 indicates the number of batteries already replaced or the number of replaceable batteries. As a result, the terminal device enables the user to understand the number of batteries disposed in each station, the ratio of renewable energy or non-renewable energy batteries, and the like.

3. Configuration of Information Processing System

Figure 3:
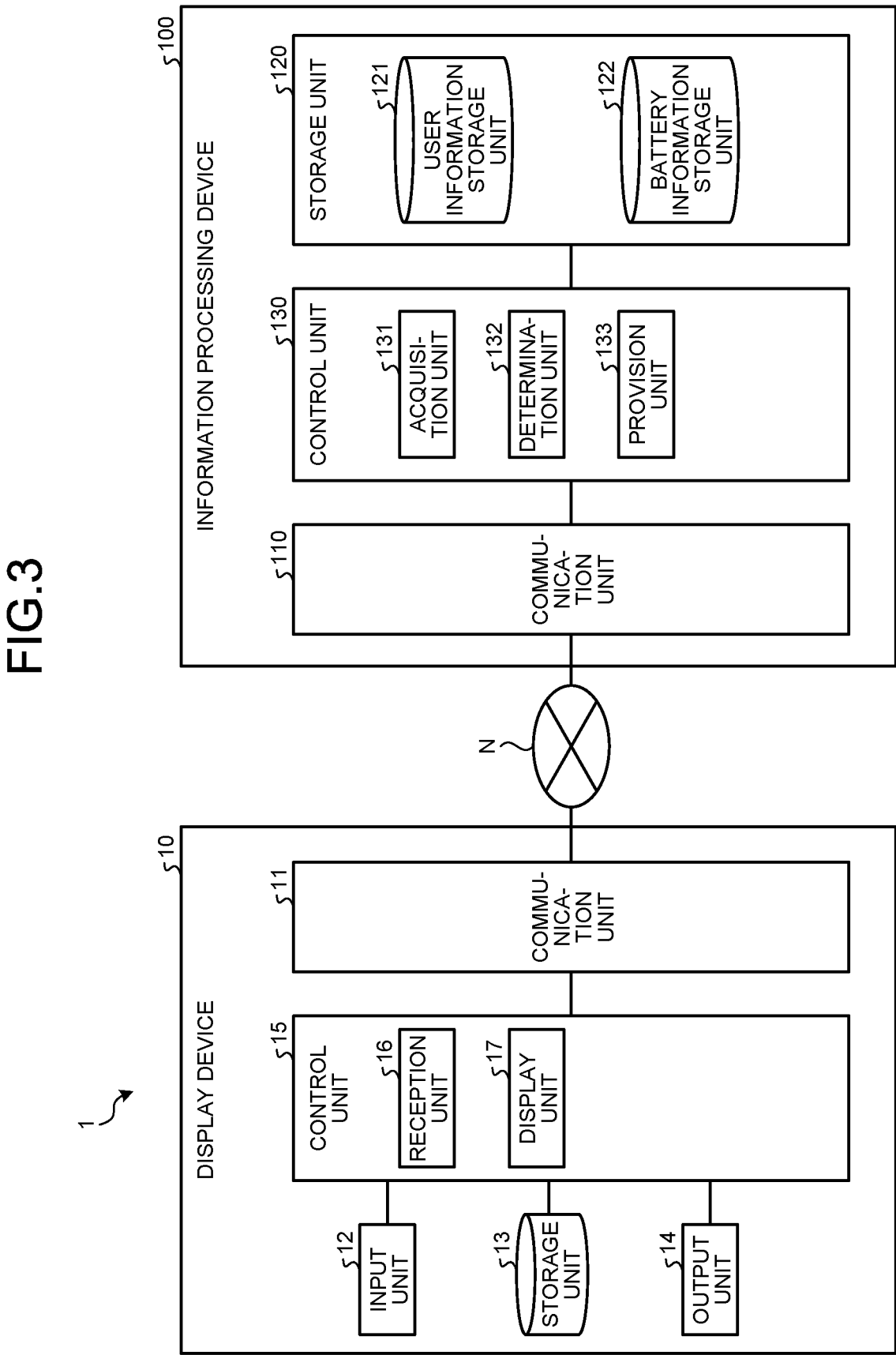
FIG. 3 is a diagram illustrating a configuration example of an information processing system according to the embodiment.

As illustrated in FIG. 3, an information processing system 1 includes a display device 10 and an information processing device 100. The display device 10 and the information processing device 100 are communicably connected in a wired or wireless manner via a network N. Note that the information processing system 1 illustrated in FIG. 3 may include a plurality of display devices 10 and a plurality of information processing devices 100.

The display device 10 according to the embodiment is an information processing device capable of communicating with an arbitrary server device or a cloud system via a wireless communication network such as Third Generation (3G) or Long Term Evolution (LTE). For example, the display device 10 includes a screen, such as a liquid crystal display, which has a touch panel function, and receives various operations on display data of content and the like, such as a tap operation, a slide operation, and a scroll operation, from the user with a finger, a stylus, or the like. Then, the display device 10 displays information relative to the recommended battery provided from the information processing device 100, information relative to another battery different from the recommended battery, and the like.

Note that the display device 10 may be any terminal device. Specifically, the terminal device may be a terminal device or the like used by a user who accesses content such as a web page or application content displayed on a browser. For example, the terminal device may be a desktop personal computer (PC), a notebook PC, a tablet terminal, a mobile phone, a personal digital assistant (PDA), a smartwatch, a wearable device (Wearable Device), or the like.

Moreover, the terminal device may have a function of detecting the current position of the terminal device at predetermined intervals (for example, one minute) using a global positioning system (GPS) sensor or the like. Note that the terminal device may be applied to any position information instead of the GPS information. For example, the terminal device may estimate or acquire the current position by using position information of a base station in communication or a radio wave of Wireless Fidelity (WiFi) (registered trademark).

The information processing device 100 according to the embodiment is an information processing device capable of communicating with various devices over a predetermined network N such as the Internet, and is implemented by, for example, a server device, a cloud system, or the like. For example, the information processing device 100 can communicate with the display device 10 via the network N.

4. Configuration of information processing device Hereinafter, an example of a functional configuration of the information processing device 100 will be described. FIG. 3 is a diagram illustrating a configuration example of the information processing device according to the embodiment. As illustrated in FIG. 3, the information processing device 100 includes a communication unit 110, a storage unit 120, and a control unit 130.

Communication Unit 110

The communication unit 110 is implemented by, for example, a network interface card (NIC) or the like. Then, the communication unit 110 is connected to the network N in a wired or wireless manner, and transmits and receives information to and from the display device 10.

Storage Unit 120

The storage unit 120 is implemented by, for example, a semiconductor memory element such as a random access memory (RAM) or a flash memory, or a storage device such as a hard disk or an optical disk. In addition, the storage unit 120 includes a user information storage unit 121 and a battery information storage unit 122.

User Information Storage Unit 121

The user information storage unit 121 stores various types of information relative to the user. Here, FIG. 4 illustrates an example of the user information storage unit 121 according to the embodiment. In the example illustrated in FIG. 4, the user information storage unit 121 stores a "user identifier (ID)" and user information in association with each other. For example, the user information storage unit 121 has items such as "use history", "attribute information", "interest", "use history of moving object", and "position information" as the user information.

The "user ID" is an identifier for identifying a user. The "use history" is a use history of a battery associated with the "user ID". For example, the use history is a use history of a battery charged with renewable energy, a use history of a battery charged with non-renewable energy, or the like. Further, the use history may include a frequency of replacement of the battery, a travel distance of an electric motorcycle, or the like. The "attribute information" is attribute information of a user associated with the "user ID". For example, the attribute information includes the age and gender of the user, information relative to a contract with an electric power company, and the like.

The "interest" is information relative to the interest of the user associated with the "user ID". For example, the interest is an interest in the user's life style, an interest in electric power, user's interest in nature, outdoors, and environmental protection, or the like. The "use history of the moving object" is a use history related to the moving object used by the user associated with the "user ID". For example, the moving object is an electric motorcycle using a battery provided by a sharing service. In addition, the use history of the moving object includes a travel distance of each moving object, a fuel consumption tendency, and the like.

For example, in FIG. 4, "U1" identified by the user ID has a use history of "UE1", attribute information of "CA1", an interest of "IN1", a use history of a moving object of "MO1", and position information of "LO1".

Note that in the example illustrated in FIG. 4, each user information is expressed by an abstract code, but each user information may be a specific numerical value, a specific file format, or the like. In addition, the user information storage unit 121 may store not only the above items but also various search histories of the user, browsing histories of contents related to various products or various services, purchase histories in various Internet shopping services, and the like.

Battery Information Storage Unit 122

The battery information storage unit 122 stores information relative to each battery. Here, FIG. 5 illustrates an example of the battery information storage unit 122 according to the embodiment. In the example illustrated in FIG. 5, the battery information storage unit 122 stores "battery ID" and battery information that is information relative to the battery in association with each other. For example, the battery information storage unit 122 has items such as "source information", "fee information", "power value", and "use history" as the battery information. In addition, the battery information storage unit 122 has items such as "user ID" and "use history" as the battery information.

The "battery ID" is an identifier for identifying a battery. The "source information" is source information indicating the source of the power charged in the battery associated with the "battery ID". The "fee information" is fee information indicating a usage fee corresponding to the source of the power charged in the battery associated with the "battery ID".

The "power value" is a value of power charged in the battery associated with the "battery ID". The "user ID" is an identifier for identifying a user. The "use history" is a use history of a battery associated with the "user ID".

For example, in FIG. 5, "B1" identified by the battery ID has the source information of "renewable energy", the fee information of "DA1", the power value of "VO #1", the user ID of "U1", and the user history of "UE1". Note that, in the example illustrated in FIG. 5, each battery information is expressed by an abstract code, but each battery information may be a specific numerical value, a specific file format, or the like.

Control Unit 130

The control unit 130 is a controller, and is implemented, for example, by a central processing unit (CPU), a micro processing unit (MPU), or the like executing various programs (corresponding to an example of an information processing program) stored in a storage device inside the information processing device 100 using a RAM as a work area. Moreover, the control unit 130 is a controller, and is implemented by, for example, an integrated circuit such as an application specific integrated circuit (ASIC) or a field programmable gate array (FPGA).

As illustrated in FIG. 3, the control unit 130 includes an acquisition unit 131, a determination unit 132, and a provision unit 133, and implements or executes a function and an action of information processing described below. Note that the internal configuration of the control unit 130 is not limited to the configuration illustrated in FIG. 3, and may be another configuration as long as information processing to be described later is performed. Moreover, the connection relationship of the processing units included in the control unit 130 is not limited to the connection relationship illustrated in FIG. 3, and may be another connection relationship.

Acquisition Unit 131

The acquisition unit 131 acquires various types of information. Specifically, the acquisition unit 131 acquires user information that is information relative to the user. For example, the acquisition unit 131 acquires, as the user information, a use history of a battery, attribute information relative to an attribute of the user, information relative to an interest of the user, a use history of an electric motorcycle or another moving object different from the electric motorcycle, position information indicating a position of the user, and the like. Then, the acquisition unit 131 stores the user information in the user information storage unit 121.

In addition, the acquisition unit 131 acquires, as the user information, source information indicating the source of the power charged in the battery used by the user from the terminal device, an in-vehicle device included in the electric motorcycle, or an external device. In addition, the acquisition unit 131 acquires, as the user information, fee information indicating a usage fee corresponding to the source of the power charged in the battery from the terminal device or the external device.

Determination Unit 132

The determination unit 132 determines various types of information. Specifically, the determination unit 132 determines a recommended battery that is recommended to the user and used for the moving object, on the basis of the user information acquired by the acquisition unit 131.

For example, when a battery whose source information of the battery is renewable energy is used a predetermined number of times or more, the determination unit 132 determines, as the recommended battery, the battery BA1 charged with power obtained from solar power generation, wind power generation, hydraulic power generation, or the like as renewable energy. On the other hand, when the battery whose source information of the battery is non-renewable energy is used a predetermined number of times or more, the determination unit 132 determines, as the recommended battery, the battery BA1 charged with power obtained from thermal power generation or the like as non-renewable energy.

Moreover, the determination unit 132 determines the recommended battery in accordance with the fee information indicating the usage fee of the battery used by the user. For example, when the usage fee indicated by the fee information is less than the predetermined threshold, the determination unit 132 determines, as the recommended battery, the battery BA1 charged with the non-renewable energy that can be used at a lower usage fee than the battery charged with the renewable energy.

In addition, the determination unit 132 determines a recommended battery on the basis of the battery fee information and the battery source information. For example, the determination unit 132 determines a recommended battery in accordance with a model generated on the basis of fee information and source information of batteries used by the user in the past by a conventional technique such as multi-agent simulation.

In addition, the determination unit 132 determines, as the user information, the recommended battery on the basis of the attribute information relative to the attribute of the user. For example, when the user is a man in his twenties, the determination unit 132 determines, as the recommended battery, the battery BA1 charged with power obtained from solar power generation, wind power generation, hydraulic power generation, or the like. In addition, when the user is a woman in her 50s, the determination unit 132 determines the battery BA1 charged with power obtained from thermal power generation or the like as the recommended battery.

For example, in general, when the age of the user is included in the younger generation in teens and twenties, there is a tendency to prefer a battery derived from environmental power such as solar power generation, wind power generation, or hydraulic power generation. In addition, in general, when the age of the user is included in the elderly group, there is a tendency that the interest in the derived power is low and the low-cost battery is preferred. Therefore, the determination unit 132 estimates the preference of each user regarding the environment on the basis of the attribute information, and determines the recommended battery in accordance with the estimation result. Note that the attribute information and the preference of the user regarding power may be stored in advance in association with each other in the storage unit 120. Note that the relationship between the exemplified attribute information and the preference regarding power is an example, and the present invention is not limited thereto. In addition, a configuration may be employed in which an administrator can change the relationship between the attribute information and the recommended battery in accordance with a survey result or the like.

Moreover, the determination unit 132 determines the recommended battery as the user information relative to the basis of the information relative to the interest of the user. For example, when the user browses content related to environmental protection by a predetermined threshold or more, the determination unit 132 determines, as the recommended battery, the battery BA1 charged with power obtained from solar power generation, wind power generation, hydraulic power generation, or the like. On the other hand, the determination unit 132 recommends a low-cost battery regardless of the derived power in a case where the user browses content related to environmental protection less than a predetermined threshold. In general, power obtained from thermal power generation or the like is cheaper than environmental power such as solar power generation, wind power generation, or hydraulic power generation. Therefore, in a case where the user browses content related to environmental protection less than a predetermined threshold, the determination unit 132 determines the battery BA1 charged with power obtained from thermal power generation or the like as the recommended battery.

In addition, the determination unit 132 determines, as the user information, a recommended battery on the basis of a use history of a moving object of the user. For example, when the user moves a travel distance equal to or longer than a predetermined distance, the determination unit 132 determines the battery BA1 charged with power obtained from thermal power generation or the like as the recommended battery. On the other hand, when the user moves a travel distance less than the predetermined distance, the determination unit 132 determines, as the recommended battery, the battery BA1 charged with power obtained from solar power generation, wind power generation, hydraulic power generation, or the like.

For example, when the user has replaced the battery a predetermined number of times or more, the determination unit 132 determines the battery BA1 charged with power obtained from thermal power generation or the like as the recommended battery. On the other hand, when the user has replaced the battery less than the predetermined number of times, the determination unit 132 determines, as the recommended battery, the battery BA1 charged with power obtained from solar power generation, wind power generation, hydraulic power generation, or the like.

Moreover, the determination unit 132 determines a recommended battery on the basis of position information indicating the position of the user as the user information. For example, in a case where the position information is less than a predetermined distance from the station ST1 having many renewable energy batteries, the determination unit 132 determines, as the recommended battery, the battery BA1 charged with power obtained from solar power generation, wind power generation, hydraulic power generation, or the like as renewable energy. For example, in a case where the user's residential area is a suburban area rich in nature away from the city center by a predetermined distance, it is estimated that the user is highly conscious of environmental protection and the like, and thus the determination unit 132 determines the battery BA1 charged with power obtained from solar power generation, wind power generation, hydraulic power generation, or the like, as the recommended battery. Note that the attribute information may include the address of the user. In this case, the determination unit 132 may determine the recommended battery in accordance with the region including the address included in the attribute information. In addition, the region and the level of environmental awareness in the region may be stored in advance in association with each other in the storage unit 120.

In addition, the determination unit 132 may determine the recommended battery by combining multiple methods for determination described above, or may preferentially employ any of the determination methods. For example, the determination unit 132 may classify a user in which a battery charged with power derived from renewable energy is used a predetermined number of times or more as the "environment-oriented type", and the determination unit 132 may classify a user whose average usage fee indicated by the fee information is less than a predetermined threshold as the "cost-oriented type", and may classify a user who is not the "environment-oriented type" or the "cost-oriented type" as the "intermediate type". In this case, the determination unit 132 determines to recommend a battery charged with power derived from renewable energy to the "environment-oriented type" user, and to recommend a low-cost battery to the "cost-oriented type" user regardless of the derived power. In addition, the determination unit 132 applies determination of a recommended battery by use of a model such as the above-described multi-agent simulation or determination of a recommended battery by estimation based on the above-described attribute information, use history, position information, and the like to the user of the "intermediate type".

Provision Unit 133

The provision unit 133 provides various types of information. Specifically, the provision unit 133 provides information relative to the recommended battery determined by the determination unit 132. For example, in the example of FIG. 1, it is assumed that the station ST1 has the display device 10 in advance. In this case, the information processing device 100 provides the display device 10 with information relative to the battery BA1.

Moreover, the provision unit 133 provides information relative to a predetermined station in which the recommended battery is disposed. For example, in the example of FIG. 2, the provision unit 133 provides the content C1 including information relative to various stations in a mode superimposed on map information. Here, the content C1 indicates different information depending on shading of an icon of the station. For example, a station ST1 has a large number of batteries charged with renewable energy, a station ST2 has a medium number of batteries charged with renewable energy, and a station ST3 has a small number of batteries charged with renewable energy.

In addition, the provision unit 133 causes a predetermined display device to display information for identifying a recommended battery out of batteries disposed in the predetermined station. For example, in the example of FIG. 2, the provision unit 133 provides content C2 including a title such as "battery display" and identification information of a battery stored in the station ST1. For example, in the content C2, a battery surrounded by a solid line indicates a battery charged with renewable energy, and a battery surrounded by a dotted line indicates a battery charged with non-renewable energy.

5. Configuration of Display Device

Moreover, a configuration of the display device 10 according to the embodiment will be described with reference to FIG. 3. FIG. 3 is a diagram illustrating a configuration example of the display device 10 according to the embodiment. As illustrated in FIG. 3, the display device 10 includes a communication unit 11, an input unit 12, a storage unit 13, an output unit 14, and a control unit 15.

Communication Unit 11

The communication unit 11 is implemented by, for example, an NIC or the like. Then, the communication unit 11 is connected to the network N in a wired or wireless manner, and transmits and receives information to and from the information processing device 100.

Input Unit 12

The input unit 12 receives various operations from the user. For example, the input unit 12 may receive various operations from the user via the display surface by a touch panel function. Moreover, the input unit 12 may receive various operations from buttons provided on the display device 10 or a keyboard or a mouse connected to the display device 10.

Storage Unit 13

The storage unit 13 stores various types of information. The storage unit 13 is implemented by, for example, a semiconductor memory element such as a RAM or a flash memory, or a storage device such as a hard disk or an optical disk.

Output Unit 14

The output unit 14 is a display screen of a tablet terminal or the like implemented by, for example, a liquid crystal display, an organic electro-luminescence (EL) display, or the like, and displays various types of information.

Control Unit 15

The control unit 15 is a controller, and is implemented by, for example, a CPU, an MPU, or the like executing various programs stored in a storage device inside the display device 10 using a RAM as a work area. Moreover, the control unit 15 is a controller, and is implemented by, for example, an integrated circuit such as an ASIC or an FPGA.

As illustrated in FIG. 3, the control unit 15 includes a reception unit 16 and a display unit 17, and realizes or executes a function and an action of information processing described below. Note that the internal configuration of the control unit 15 is not limited to the configuration illustrated in FIG. 3, and may be another configuration as long as information processing to be described later is performed. Moreover, the connection relationship of the processing units included in the control unit 15 is not limited to the connection relationship illustrated in FIG. 3, and may be another connection relationship.

Reception Unit 16

The reception unit 16 receives various types of information. Specifically, the reception unit 16 receives information relative to the recommended battery from the information processing device 100.

Display Unit 17

The display unit 17 displays various types of information. Specifically, the display unit 17 displays information relative to the recommended battery. In addition, the display unit 17 displays information relative to the recommended battery and another battery different from the recommended battery.

For example, the display unit 17 displays information relative to the battery BA1 to the user. In addition, the display unit 17 displays information relative to the battery BA1 and another battery different from the battery BA1 to the user. At this time, the display unit 17 displays the information relative to the battery BA1 in a predetermined display mode. For example, the display unit 17 changes the color of the battery BA1 recommended to the user according to the ratio of the source indicated by the source information of the power charged in the battery.

For example, the display unit 17 presents the battery BA1 in a mode such as lighting or blinking so that the battery BA1 recommended to the user can be determined. At this time, the display unit 17 presents a predetermined portion of the battery BA1 in such a manner as to light up in green. Note that the predetermined portion may be any portion of the battery BA1, and is, for example, an upper portion, a side portion, or the like of the battery BA1. In addition, the display unit 17 may change the color of the light emitting unit installed around the battery BA1. For example, the light emitting unit may be provided in a frame surrounding the battery BA1 in the storage device to which the battery BA1 is fixed. In this case, the display unit 17 presents the battery BA1 recommended to the user by changing or blinking the color of the light emitting unit provided in the frame surrounding the battery BA1.

For example, the display unit 17 presents the recommended battery BA1 by providing voice information to the user. At this time, the display unit 17 outputs a voice such as "Please replace the battery with the battery of XX" as the voice information. Moreover, in a case where the user conveys, by voice, the request for the presentation of the information relative to the recommended battery, the voice recognition may be performed, and a voice such as "Please replace the battery with the battery of XX" may be output as the voice information.

For example, the display unit 17 releases the fixation of the battery BA1 recommended to the user out of batteries fixed to the predetermined station, and then presents the battery BA1 in a flying mode.

6. Processing Procedure

Figure 6:
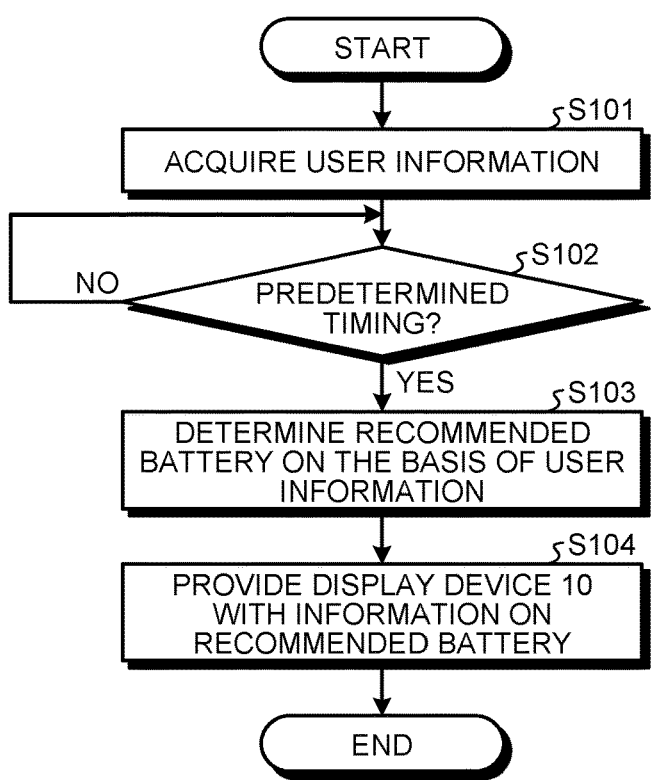
FIG. 6 is a flowchart illustrating an example of a flow of information processing executed by the information processing device according to the embodiment.

Next, a procedure of information processing executed by the information processing device 100 according to the embodiment will be described with reference to FIG. 6. FIG. 6 is a flowchart illustrating an example of a flow of information processing executed by the information processing device 100 according to the embodiment.

As illustrated in FIG. 6, the acquisition unit 131 acquires user information (step S101). Then, the determination unit 132 determines whether or not it is a predetermined timing (step S102). Then, when determining that it is not the predetermined timing (step S102; No), the determination unit 132 returns to before step S101.

On the other hand, when determining that it is the predetermined timing (step S102; Yes), the determination unit 132 determines a recommended battery on the basis of the user information (step S103). Then, the provision unit 133 provides the display device 10 with information relative to the recommended battery (step S104).

7. Modification

The information processing device 100 described above may be implemented in various different forms other than the above embodiments. Therefore, another embodiment of the information processing device 100 will be described below.

7-1. Moving Object

In the above embodiment, the electric motorcycle using the battery provided by the sharing service has been described as an example, but the present invention may be applied to any moving object instead of the electric motorcycle. For example, the moving object is an electric bicycle, an electric four-wheeled vehicle, an electric kickboard, or the like. That is, the moving object may be any moving object as long as the moving object is driven by a battery. Moreover, the moving object may include an in-vehicle device including the display device 10.

7-2. Battery

In the above embodiment, an example in which the battery is a portable battery and is a replaceable battery for driving a moving object has been described, but the battery is not limited thereto, and may have a microcontroller. In this case, the battery may incorporate a display device.

For example, the battery may store a use history or various battery information used by the user. Then, the information processing device 100 may acquire the user information from the battery and determine the recommended battery. The recommended battery may display information relative to the battery to the user. As a result, the battery can visualize various kinds of user information and battery information, so that convenience of the battery can be improved for the user. In addition, since the battery can vary the display of the battery main body, it is possible to prevent the user from erroneously mounting the battery. Note that the battery is not limited to the above example, and may be any battery.

7-3. Display Device

In the above embodiment, an example of the display process in which the display device 10 displays the information relative to the recommended battery has been described, but the display process is not limited to the above display process. For example, the display device 10 may receive a reservation for battery replacement from the user. For example, the display device 10 displays a content C3 including the identification information of the battery stored in the station ST1. Here, in the content C3, a battery surrounded by a solid line indicates a battery charged with renewable energy, and a battery surrounded by a dotted line indicates a battery charged with non-renewable energy. Then, when the renewable energy battery is selected by the user, the display device 10 may receive a reservation related to replacement of the renewable energy battery. As described above, the display device 10 can provide an appropriate battery replacement service at a timing desired by the user.

7-4. Provision Process

In the above embodiment, an example of a provision process in which the information processing device 100 provides the information relative to the determined recommended battery has been described, but the provision process is not limited to the above provision process. Specifically, the information processing device 100 may provide the display device 10 with information relative to a predetermined benefit together with the information relative to the recommended battery.

For example, the information processing device 100 may provide information relative to a point that can be used for purchase of a product or use of a service to the display device 10, for example, a terminal device owned by the user as a predetermined benefit together with the information relative to the recommended battery. Here, the point is a token such as virtual currency or the like. For example, in a case where a user uses a battery derived from power in which an amount of carbon dioxide generated during power generation is small, a point may be given to the user. Moreover, the transmission destination of the information relative to the predetermined benefit is not limited to the display device 10, and may be another information processing device. Note that the predetermined benefit is not limited to the points, and may be, for example, a coupon or electronic money that can be used in the same manner as cash for which a discount can be received when purchasing a product or using a service.

As described above, since the information processing device 100 according to the embodiment provides the predetermined display device with the information relative to the predetermined benefit together with the information relative to the recommended battery, the convenience of the battery provided by the sharing service can be improved.

7-5. Program

Figure 7:
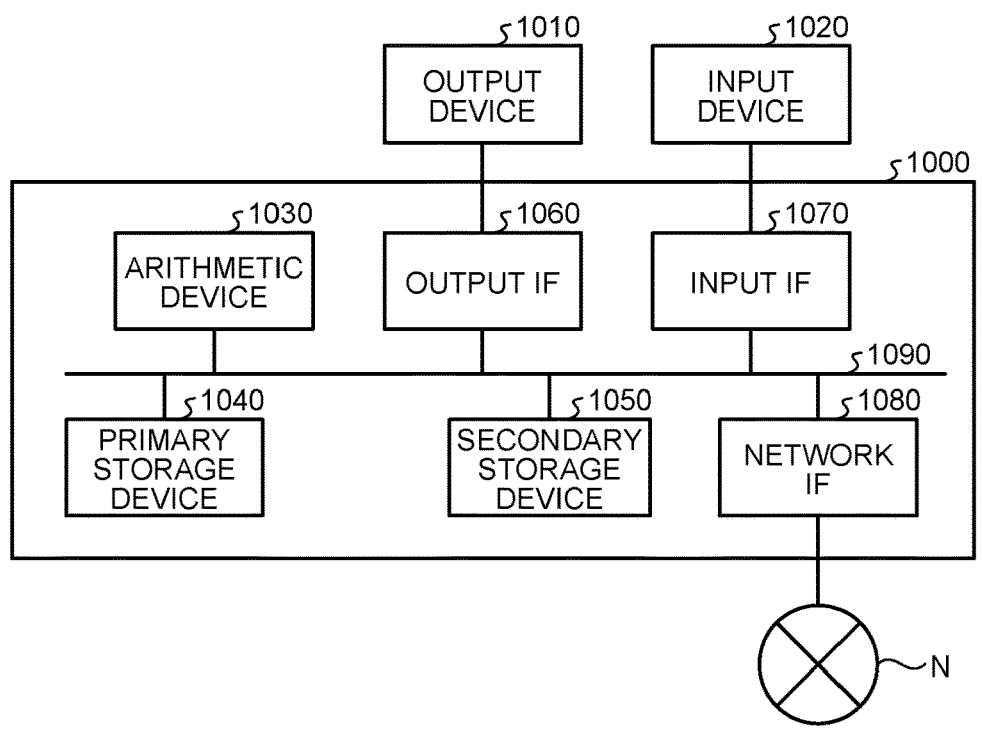
FIG. 7 is a hardware configuration diagram illustrating an example of a computer that implements functions of an information processing device.

Moreover, the information processing device 100 according to the above-described embodiment is implemented by, for example, a computer 1000 having a configuration as illustrated in FIG. 7. FIG. 7 is a diagram illustrating an example of a hardware configuration. The computer 1000 is connected to an output device 1010 and an input device 1020, and has a form in which an arithmetic device 1030, a primary storage device 1040, a secondary storage device 1050, an output interface (IF) 1060, an input IF 1070, and a network IF 1080 are connected by a bus 1090.

The arithmetic device 1030 operates on the basis of a program stored in the primary storage device 1040 or the secondary storage device 1050, a program read from the input device 1020, or the like, and executes various processes. The primary storage device 1040 is a memory device such as a RAM that temporarily stores data used for various calculations by the arithmetic device 1030. In addition, the secondary storage device 1050 is a storage device in which data used for various arithmetic operations by the arithmetic device 1030 and various databases are registered, and is implemented by a read only memory (ROM), a hard disk drive (HDD), a flash memory, and the like.

The output IF 1060 is an interface for transmitting information to be output to the output device 1010 that outputs various types of information such as a monitor and a printer, and is implemented by, for example, a connector of a standard such as a universal serial bus (USB), a digital visual interface (DVI), or a high definition multimedia interface (HDMI) (registered trademark). Moreover, the input IF 1070 is an interface for receiving information from various input devices 1020 such as a mouse, a keyboard, and a scanner, and is implemented by, for example, a USB or the like.

Note that the input device 1020 may be, for example, a device that reads information from an optical recording medium such as a compact disc (CD), a digital versatile disc (DVD), or a phase change rewritable disk (PD), a magneto-optical recording medium such as a magneto-optical disk (MO), a tape medium, a magnetic recording medium, a semiconductor memory, or the like. Moreover, the input device 1020 may be an external storage medium such as a USB memory.

The network IF 1080 receives data from another device via the network N and transmits the data to the arithmetic device 1030, and transmits data generated by the arithmetic device 1030 to another device via the network N.

The arithmetic device 1030 controls the output device 1010 and the input device 1020 via the output IF 1060 and the input IF 1070. For example, the arithmetic device 1030 loads a program from the input device 1020 or the secondary storage device 1050 onto the primary storage device 1040, and executes the loaded program.

For example, in a case where the computer 1000 functions as the information processing device 100, the arithmetic device 1030 of the computer 1000 implements the function of the control unit 130 by executing a program loaded on the primary storage device 1040.

7-6. Others

In the processes described in the above embodiment and modifications, all or part of the processes described as being automatically performed can be manually performed, or all or part of the processes described as being manually performed can be automatically performed by a known method. In addition, the processing procedure, specific name, and information including various data and parameters illustrated in the document and the drawings can be arbitrarily changed unless otherwise specified. For example, the various types of information illustrated in each figure are not limited to the illustrated information.

In addition, each component of each device illustrated in the drawings is functionally conceptual, and is not necessarily physically configured as illustrated in the drawings. That is, a specific form of distribution and integration of each device is not limited to the illustrated form, and all or a part thereof can be functionally or physically distributed and integrated in an arbitrary unit according to various loads, usage conditions, and the like.

In addition, the above-described embodiments and modifications can be appropriately combined within a range that does not contradict processing contents.

In addition, the "Part (section, module, unit)" described above can be read as "means", "circuit", or the like. For example, the provision unit can be replaced with provision means or a provision circuit.

8. Effects

As described above, the information processing device 100 according to the embodiment includes the acquisition unit 131, the determination unit 132, and the provision unit 133. The acquisition unit 131 acquires user information that is information relative to a user. On the basis of the user information acquired by the acquisition unit 131, the determination unit 132 determines a recommended battery recommended to the user and used for the moving object. The provision unit 133 provides information relative to the recommended battery determined by the determination unit 132.

As a result, the information processing device 100 according to the embodiment provides information relative to a recommended battery that is a recommended battery recommended to the user determined on the basis of the user information that is information relative to the user and is used for the moving object, so that an appropriate battery can be provided to the user.

Moreover, in the information processing device 100 according to the embodiment, the acquisition unit 131 acquires, as the user information, the source information indicating the source of the power charged in the battery used by the user, and the determination unit 132 determines the recommended battery in accordance with the source of the power indicated by the source information.

As a result, the information processing device 100 according to the embodiment acquires, as the user information, the source information indicating the source of the power charged in the battery used by the user, and determines the recommended battery in accordance with the source of the power indicated by the source information, so that an appropriate battery can be provided to the user.

Moreover, in the information processing device 100 according to the embodiment, the determination unit 132 specifies a source having the highest ratio out of sources of the power charged in the battery used by the user on the basis of the source information, and determines the battery charged with the power of the specified source as the recommended battery.

As a result, the information processing device 100 according to the embodiment specifies the source having the highest ratio out of the sources of the power charged in the battery used by the user on the basis of the source information, and determines the battery charged with the power of the specified source as the recommended battery, so that an appropriate battery can be provided to the user.

Moreover, in the information processing device 100 according to the embodiment, the acquisition unit 131 acquires the source information registered in the storage unit included in the battery.

As a result, the information processing device 100 according to the embodiment acquires the source information registered in the storage unit included in the battery, so that an appropriate battery can be provided to the user.

Moreover, in the information processing device 100 according to the embodiment, the acquisition unit 131 acquires, as the user information, fee information indicating the usage fee of the battery used by the user, and the determination unit 132 determines the recommended battery in accordance with the fee information.

As a result, the information processing device 100 according to the embodiment acquires, as the user information, the fee information indicating the usage fee of the battery used by the user, and determines the recommended battery in accordance with the fee information, so that an appropriate battery can be provided to the user.

In addition, in the information processing device 100 according to the embodiment, the acquisition unit 131 acquires fee information indicating the usage fee according to the source of the power charged in the battery.

As a result, the information processing device 100 according to the embodiment acquires the fee information indicating the usage fee corresponding to the source of the power charged in the battery, so that an appropriate battery can be provided to the user.

Moreover, in the information processing device 100 according to the embodiment, the acquisition unit 131 acquires, as the user information, attribute information relative to the attribute of the user, and the determination unit 132 determines the recommended battery on the basis of the attribute information.

As a result, the information processing device 100 according to the embodiment acquires, as the user information, the attribute information relative to the attribute of the user, and determines the recommended battery on the basis of the attribute information, so that an appropriate battery can be provided to the user.

Moreover, in the information processing device 100 according to the embodiment, the acquisition unit 131 acquires, as the user information, information relative to the interest of the user, and the determination unit 132 determines the recommended battery on the basis of the information relative to the interest.

As a result, the information processing device 100 according to the embodiment acquires, as the user information, the information relative to the interest of the user, and determines the recommended battery on the basis of the information relative to the interest, so that an appropriate battery can be provided to the user.

Moreover, in the information processing device 100 according to the embodiment, the acquisition unit 131 acquires, as the user information, the use history of the moving object of the user, and the determination unit 132 determines the recommended battery on the basis of the use history.

As a result, the information processing device 100 according to the embodiment acquires, as the user information, the use history of the moving object of the user, and determines the recommended battery on the basis of the use history, so that an appropriate battery can be provided to the user.

Moreover, in the information processing device 100 according to the embodiment, the acquisition unit 131 acquires, as the user information, position information indicating the position of the user, and the determination unit 132 determines the recommended battery on the basis of the position information.

As a result, the information processing device 100 according to the embodiment acquires, as the user information, the position information indicating the position of the user, and determines the recommended battery on the basis of the position information, so that an appropriate battery can be provided to the user.

Moreover, in the information processing device 100 according to the embodiment, the provision unit 133 provides the predetermined display device 10 with information relative to a replaceable battery for driving the moving object as the information relative to the recommended battery.

As a result, the information processing device 100 according to the embodiment provides the predetermined display device 10 with the information relative to the replaceable battery for driving the moving object as the information relative to the recommended battery, so that an appropriate battery can be provided to the user.

Moreover, in the information processing device 100 according to the embodiment, the provision unit 133 provides information relative to a predetermined station in which the recommended battery is disposed.

As a result, the information processing device 100 according to the embodiment provides information relative to the predetermined station in which the recommended battery is disposed, so that an appropriate battery can be provided to the user.

Moreover, in the information processing device 100 according to the embodiment, the provision unit 133 causes a predetermined display device 10 to display information for identifying a recommended battery out of batteries disposed in a predetermined station.

As a result, the information processing device 100 according to the embodiment causes the predetermined display device 10 to display the information for identifying the recommended battery out of the batteries disposed in the predetermined station, and thus, can provide an appropriate battery to the user.

Moreover, in the information processing device 100 according to the embodiment, the provision unit 133 causes the predetermined display device 10 to display information for identifying the recommended battery, the predetermined display device 10 being the terminal device used by the user, the display device 10 provided in the recommended battery, the display device 10 provided in the moving object, or the display device 10 disposed in a predetermined station.

As a result, the information processing device 100 according to the embodiment causes the predetermined display device 10 to display the information for identifying the recommended battery, the predetermined display device 10 being the terminal device used by the user, the display device 10 provided in the recommended battery, the display device 10 provided in the moving object, or the display device 10 disposed in the predetermined station, so that an appropriate battery can be provided to the user.

Moreover, in the information processing device 100 according to the embodiment, the provision unit 133 causes the user to identify the recommended battery by releasing the fixation of the recommended battery out of batteries fixed to the predetermined station.

As a result, the information processing device 100 according to the embodiment causes the user to identify the recommended battery by releasing the fixation of the recommended battery out of the batteries fixed to the predetermined station, so that an appropriate battery can be provided to the user.

Moreover, in the information processing device 100 according to the embodiment, the provision unit 133 provides the predetermined display device 10 with the information relative to the predetermined benefit together with the information relative to the recommended battery.

As a result, the information processing device 100 according to the embodiment provides the predetermined display device 10 with the information relative to the predetermined benefit together with the information relative to the recommended battery, so that an appropriate battery can be provided to the user.

Moreover, in the information processing device 100 according to the embodiment, the provision unit 133 provides the predetermined display device 10 with the information relative to the predetermined benefit together with the information relative to the recommended battery.

As a result, the information processing device 100 according to the embodiment provides the predetermined display device 10 with the information relative to the predetermined benefit together with the information relative to the recommended battery, so that an appropriate battery can be provided to the user.

Moreover, the information processing system 1 according to the embodiment includes an information processing device 100 and a display device 10. The information processing device 100 includes an acquisition unit 131 configured to acquire user information that is information relative to a user, a determination unit 132 that determines a recommended battery recommended to the user and used for a moving object on the basis of the user information acquired by the acquisition unit 131, and a provision unit 133 that provides the display device 10 with information relative to the recommended battery determined by the determination unit, and the display device 10 includes a display unit (for example, the output unit 14) that displays the information relative to the recommended battery.

As a result, the information processing system 1 according to the embodiment provides information relative to a recommended battery that is a recommended battery recommended to the user determined on the basis of the user information that is information relative to the user and is used for the moving object, and displays the information relative to the recommended battery, so that it is possible to provide an appropriate battery to the user.

Further, in the information processing system 1 according to the embodiment, the display unit displays information relative to the recommended battery and another battery different from the recommended battery.

As a result, the information processing system 1 according to the embodiment displays information relative to the recommended battery and another battery different from the recommended battery, so that it is possible to provide an appropriate battery to the user.

Moreover, in the information processing system 1 according to the embodiment, the display unit displays information relative to the recommended battery in a predetermined display mode.

As a result, the information processing system 1 according to the embodiment displays the information relative to the recommended battery in a predetermined display mode, so that it is possible to provide an appropriate battery to the user.

Moreover, in the information processing system 1 according to the embodiment, the display unit displays information relative to a replaceable battery for driving the moving object as the information relative to the recommended battery.

As a result, the information processing system 1 according to the embodiment displays the information relative to the replaceable battery for driving the moving object as the information relative to the recommended battery, so that it is possible to provide an appropriate battery to the user.

Although several embodiments of the present disclosure have been described, these embodiments have been presented as examples, and are not intended to limit the scope of the invention. These embodiments can be implemented in various other forms, and various omissions, substitutions, and changes can be made without departing from the gist of the invention. These embodiments and modifications thereof are included in the scope and gist of the invention and are included in the invention described in the claims and the equivalent scope thereof

What is claimed is:

1. An information processing device for recommending a portable battery to be exchanged by an electric vehicle,
   the portable battery comprising:
      a microcontroller; and
      a display device configured to display user information,
   the information processing device comprising:
      a hardware processor connected to a memory and configured to:
         acquire the user information that is information relative to a user from the portable battery;
         determine a recommended battery based on the user information, the recommended battery being recommended to the user and used for a moving object; and
         provide information relative to the recommended battery,
   wherein the hardware processor acquires, as the user information, source information indicating a source of power charged in the portable battery used by the user,
   the hardware processor determines the recommended battery in accordance with the source of power indicated by the source information,
   the hardware processor specifies, based on the source information, a specified source having a highest ratio out of sources of power charged in the portable battery used by the user,
   the hardware processor determines that the recommended battery is charged with power of the specified source, and
   the recommended battery is configured to vary a display of a battery main body to prevent the user from erroneously mounting the recommended battery.

2. The information processing device according to claim 1, wherein the hardware processor acquires the source information, with the source information being registered in a memory included in the portable battery.

3. The information processing device according to claim 1, wherein the hardware processor further acquires, as the user information, fee information indicating a usage fee of the portable battery used by the user, and the hardware processor further determines the recommended battery in accordance with the fee information.

4. The information processing device according to claim 1, wherein the hardware processor further acquires fee information indicating a usage fee corresponding to the source of power charged in the portable battery.

5. The information processing device according to claim 1, wherein the hardware processor further acquires, as the user information, attribute information relative to an attribute of the user, and the hardware processor further determines the recommended battery based on the attribute information.

6. The information processing device according to claim 1, wherein the hardware processor further acquires, as the user information, information relative to an interest of the user, and the hardware processor further determines the recommended battery based on the information relative to the interest.

7. The information processing device according to claim 1, wherein the hardware processor further acquires, as the user information, a use history of the moving object of the user, and the hardware processor further determines the recommended battery based on the use history.

8. The information processing device according to claim 1, wherein the hardware processor further acquires, as the user information, position information indicating a position of the user, and the hardware processor further determines the recommended battery based on the position information.

9. The information processing device according to claim 1, wherein the hardware processor provides a predetermined display device with information relative to a replaceable battery for driving the moving object as the information relative to the recommended battery.

10. The information processing device according to claim 1, wherein the hardware processor provides information relative to a predetermined station in which the recommended battery is disposed.

11. The information processing device according to claim 10, wherein the hardware processor causes a predetermined display device to display information for identifying the recommended battery out of batteries disposed in the predetermined station.

12. The information processing device according to claim 11, wherein the hardware processor causes the predetermined display device to display the information for identifying the recommended battery, the predetermined display device being at least one of a terminal device used by the user, a display device installed in the recommended battery, a display device installed in the moving object, or a display device disposed in the predetermined station.

13. The information processing device according to claim 10, wherein the hardware processor causes the user to identify the recommended battery by releasing fixation of the recommended battery out of batteries fixed to the predetermined station.

14. The information processing device according to claim 9, wherein the hardware processor provides the predetermined display device with information relative to a predetermined benefit together with the information relative to the recommended battery.

15. An information processing system for recommending a portable battery to be exchanged by an electric vehicle, the portable battery comprising:
a microcontroller; and
a first display device configured to display user information,
the information processing system comprising:
an information processing device; and
a second display device, wherein
the information processing device includes a hardware processor connected to a memory and configured to:
acquire the user information that is information relative to a user from the portable battery;
determine a recommended battery based on the user information, the recommended battery being recommended to the user and used for a moving object; and
provide information relative to the recommended battery,
wherein the hardware processor acquires, as the user information, source information indicating a source of power charged in the portable battery used by the user,
the hardware processor determines the recommended battery in accordance with the source of power indicated by the source information,
the hardware processor specifies, based on the source information, a specified source having a highest ratio out of sources of power charged in the portable battery used by the user,
the hardware processor determines that the recommended battery is charged with power of the specified source,
the recommended battery is configured to vary a display of a battery main body to prevent the user from erroneously mounting the recommended battery, and
the second display device includes a control circuit configured to display, on a screen, the information relative to the recommended battery.

16. The information processing system according to claim 15, wherein the control circuit is configured to display the information relative to the recommended battery and another battery that is different from the recommended battery.

17. The information processing system according to claim 15, wherein the control circuit is configured to display the information relative to the recommended battery in a predetermined display mode.

18. The information processing system according to claim 15, wherein the control circuit is configured to display, as the information relative to the recommended battery, information relative to a replaceable battery for driving the moving object.

* * * * *